US012672502B2

(12) United States Patent
Sun et al.

(10) Patent No.: US 12,672,502 B2
(45) Date of Patent: Jun. 30, 2026

(54) ADDITION SYSTEM AND METHOD OF REDUCING AGENT IN SEMICONDUCTOR MANUFACTURING PROCESS

(71) Applicant: Industrial Technology Research Institute, Hsinchu (TW)

(72) Inventors: Jia-Cheng Sun, Changhua County (TW); Jui-Hsiang Cheng, Taichung City (TW); I-Ling Nien, Hsinchu County (TW); Chia-Yen Kuo, Taipei City (TW); Shou-Nan Li, Nantou County (TW)

(73) Assignee: Industrial Technology Research Institute, Hsinchu (TW)

( * ) Notice: Subject to any disclaimer, the term of this patent is extended or adjusted under 35 U.S.C. 154(b) by 434 days.

(21) Appl. No.: 18/360,771

(22) Filed: Jul. 27, 2023

(65) Prior Publication Data

US 2024/0153788 A1     May 9, 2024

(30) Foreign Application Priority Data

Nov. 3, 2022    (TW) ................................. 111142077

(51) Int. Cl.
 *B01D 50/00*          (2022.01)
 *H10P 72/00*          (2026.01)
(52) U.S. Cl.
 CPC ...... *H10P 72/0402* (2026.01); *H10P 72/0604* (2026.01)
(58) Field of Classification Search
 CPC ........ A61L 9/14; A61L 9/145; A61L 2209/00; B01D 53/46; B01D 53/50; B01D 53/56; B01D 53/34

(Continued)

(56) References Cited

U.S. PATENT DOCUMENTS

| | | | |
|---|---|---|---|
| 5,417,948 A | * | 5/1995 | Iwata ..................... B01D 53/68 |
| | | | 423/489 |
| 7,204,081 B2 | | 4/2007 | Yasui et al. |

(Continued)

FOREIGN PATENT DOCUMENTS

| | | |
|---|---|---|
| CN | 101970089 | 2/2011 |
| CN | 103657374 | 3/2014 |

(Continued)

OTHER PUBLICATIONS

"Office Action of Taiwan Counterpart Application", issued on Oct. 30, 2023, p. 1-p. 4.

(Continued)

*Primary Examiner* — Monzer R Chorbaji
(74) *Attorney, Agent, or Firm* — JCIPRNET

(57)               ABSTRACT

An addition system of a reducing agent in a semiconductor manufacturing process includes pre-treatment and post-treatment gas concentration detection devices, a process exhaust gas treatment device, a reducing agent supply device, and an addition system control device. The process exhaust gas treatment device purifies exhaust gas of a semiconductor manufacturing process and emits a post-treatment gas. The reducing agent supply device supplies a reducing agent gas into the process exhaust gas treatment device. The post-treatment gas concentration detection device detects a residual concentration of the reducing agent gas in the post-treatment gas. The addition system control device calculates destruction and removal efficiency (DRE) for process gases according to pre-treatment and post-treatment gas concentrations, and, according to the DRE and the residual concentration, sends a signal to the reducing agent supply device to control the amount of the reducing agent gas added.

14 Claims, 10 Drawing Sheets

(58) Field of Classification Search
USPC .................. 422/168, 170, 171, 178; 423/210
See application file for complete search history.

(56) References Cited

U.S. PATENT DOCUMENTS

| | | | | |
|---|---|---|---|---|
| 7,396,514 B2 * | 7/2008 | Hammel | ................ | B01D 53/12 |
| | | | | 422/168 |
| 8,181,451 B2 * | 5/2012 | VanderVeen | ....... | B01D 53/8696 |
| | | | | 110/345 |
| 2020/0399759 A1 | 12/2020 | Yamazaki et al. | | |

FOREIGN PATENT DOCUMENTS

| | | |
|---|---|---|
| CN | 103728994 | 8/2016 |
| CN | 104501163 | 1/2017 |
| CN | 109200785 | 1/2019 |
| CN | 112058067 | 12/2020 |
| CN | 113466398 | 10/2021 |
| EP | 0916388 | 4/2005 |
| JP | S5676021 | 6/1981 |
| JP | H09213596 | 8/1997 |
| JP | 2003290630 | 10/2003 |
| JP | 2005125285 | 5/2005 |
| JP | 2005535435 | 11/2005 |
| JP | 2009183828 | 8/2009 |
| TW | 201029723 | 8/2010 |
| TW | I429477 | 3/2014 |
| TW | I450755 | 9/2014 |
| TW | M528512 | 9/2016 |

OTHER PUBLICATIONS

Xiao Wu et al., "Data-Driven Disturbance Rejection Predictive Control for SCR Denitrification System", Industrial & Engineering Chemistry Research, May 3, 2016, pp. 5923-5930.

Jan E. Johnsson, "Formation and reduction of nitrogen oxides in fluidized-bed combustion", Fuel, vol. 73, No. 9, Sep. 1994, pp. 1398-1415.

Joo H. Lee et al., "Catalytic combustion of methane", Fuel Processing Technology, vol. 42, Issues 2-3, Apr. 1995, pp. 339-359.

Elizabeth Vileno et al., "Thermal Decomposition of NF3 by Ti, Si, and Sn Powders", Chemistry of Materials, Apr. 1, 1995, pp. 683-687.

Lingchao Zeng et al., "Adaptive disturbance rejection model predictive control and its application in a selective catalytic reduction denitrification system", Computers and Chemical Engineering, vol. 140, Sep. 2, 2020, pp. 1-12.

Yang Ma et al., "Research on Control Strategy of SCR Denitration based on Advanced Control Technology", Advances in Computer Science Research (ACSR), vol. 61, Mar. 2017, pp. 1038-1042.

"Notice of allowance of Japan Counterpart Application", issued on Oct. 18, 2024, p. 1-p. 3.

* cited by examiner

ADDITION SYSTEM AND METHOD OF REDUCING AGENT IN SEMICONDUCTOR MANUFACTURING PROCESS

CROSS-REFERENCE TO RELATED APPLICATION

This application claims the priority benefit of Taiwan application serial no. 111142077, filed on Nov. 3, 2022. The entirety of the above-mentioned patent application is hereby incorporated by reference herein and made a part of this specification.

TECHNICAL FIELD

The technical field relates to an addition system and method of a reducing agent in a semiconductor manufacturing process.

BACKGROUND

Manufacturing of semiconductors is basically started with a silicon wafer which goes through a series of process steps such as photolithography, chemical vapor deposition, ion implantation, etching, and chemical mechanical polishing. In these processes, a large amount of chemical components are usually used for molecular dissociation and association. Thus, after each process in a semiconductor manufacturing process is completed, a large amount of residual process chemical gases are generated. These gases may cause significant harm to the atmospheric environment and human health if emitted without treatment, and therefore need to be eliminated by a process gas treatment apparatus.

It has been known to improve treatment efficiency of the process gas treatment apparatus by addition of a reducing agent. However, due to the difficulty in controlling a flow rate of the reducing agent in real time, the treatment efficiency of the apparatus is unlikely to be accurately maintained. Moreover, an excessively high concentration of the emitted reducing agent may be caused, which violates safety standards for the use of the reducing agent.

SUMMARY

An addition system of a reducing agent in a semiconductor manufacturing process according to one of exemplary embodiments is adapted to control the amount of a reducing agent added for a semiconductor manufacturing process exhaust gas. The addition system includes a pre-treatment gas concentration detection device, a process exhaust gas treatment device, a reducing agent supply device, a post-treatment gas concentration detection device, and an addition system control device. The pre-treatment gas concentration detection device is used to detect a pre-treatment concentration of various process gases in the semiconductor manufacturing process exhaust gas. The process exhaust gas treatment device is used to purify the semiconductor manufacturing process exhaust gas and emit a post-treatment gas. The reducing agent supply device is used to supply a reducing agent gas into the process exhaust gas treatment device. The post-treatment gas concentration detection device is used to detect a post-treatment concentration of the process gases and a residual concentration of the reducing agent gas in the post-treatment gas. The addition system control device is used to calculate destruction and removal efficiency (DRE) for the process gases according to the pre-treatment concentration and the post-treatment concentration, and, according to the DRE and the residual concentration of the reducing agent gas, send a signal to the reducing agent supply device to control the amount of the reducing agent gas added.

An addition method of a reducing agent in a semiconductor manufacturing process according to one of exemplary embodiments includes the following. A pre-treatment concentration of various process gases in a semiconductor manufacturing process exhaust gas before entry into a process exhaust gas treatment device is detected. The semiconductor manufacturing process exhaust gas is purified using the process exhaust gas treatment device, in which a reducing agent gas is added into the process exhaust gas treatment device. A post-treatment concentration of the process gases and a residual concentration of the reducing agent gas in a post-treatment gas emitted from the process exhaust gas treatment device are detected. Destruction and removal efficiency (DRE) for the process gases is calculated according to the pre-treatment concentration and the post-treatment concentration, and the amount of the reducing agent gas added is determined according to the DRE and the residual concentration of the reducing agent gas.

Several exemplary embodiments accompanied with figures are described in detail below to further describe the disclosure in details.

BRIEF DESCRIPTION OF THE DRAWINGS

The accompanying drawings are included to provide a further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
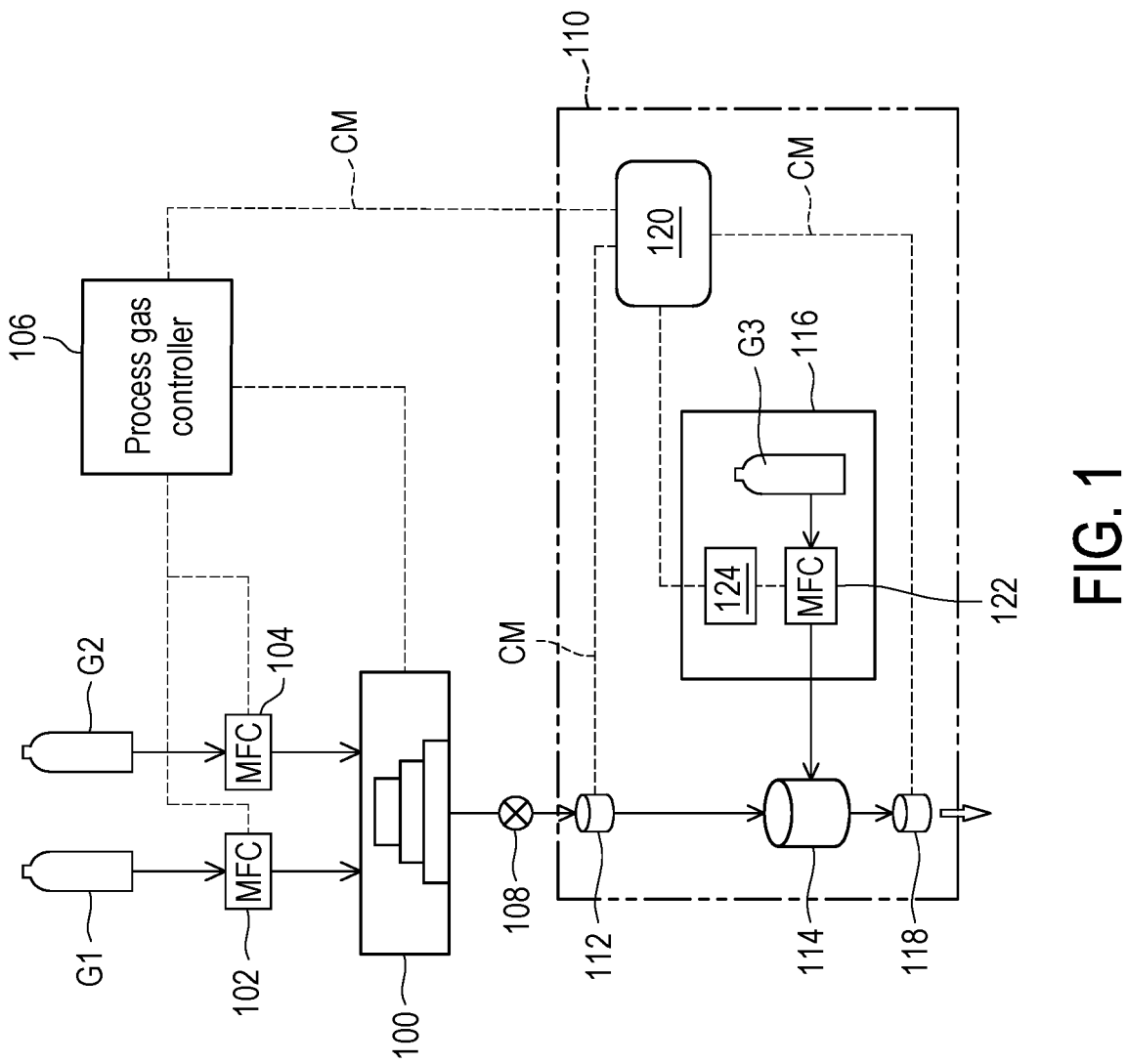
FIG. 1 is a block schematic diagram of a reducing agent addition system in a semiconductor manufacturing process according to a first embodiment of the disclosure.

FIG. 1 is a block schematic diagram of a reducing agent addition system in a semiconductor manufacturing process according to a first embodiment of the disclosure.

Referring to FIG. 1, a reducing agent addition system 110 in a semiconductor manufacturing process of the first embodiment is used to control the amount of a reducing agent added for a semiconductor manufacturing process exhaust gas. For example, when two process gases are used in a semiconductor manufacturing process, the two process gases are respectively supplied from a first process gas cylinder G1 and a second process gas cylinder G2 to a semiconductor manufacturing process reaction chamber 100. A flow rate of the two process gases entering the semiconductor manufacturing process reaction chamber 100 is determined by mass flow controllers (MFCs) 102 and 104 controlled by a process gas controller 106. Then, the semiconductor manufacturing process exhaust gas generated after completion of the semiconductor manufacturing process enters the reducing agent addition system 110 in the semiconductor manufacturing process through a pump 108. While FIG. 1 only illustrates two process gases, it is to be understood that the disclosure may be applied to a semiconductor manufacturing process using two or more process gases and is not limited to the devices illustrated in FIG. 1.

Referring still to FIG. 1, the reducing agent addition system 110 in the semiconductor manufacturing process of the present embodiment basically includes a pre-treatment gas concentration detection device 112, a process exhaust gas treatment device 114, a reducing agent supply device 116, a post-treatment gas concentration detection device 118, and an addition system control device 120. The pre-treatment gas concentration detection device 112 is used to detect a pre-treatment concentration of various process gases in the semiconductor manufacturing process exhaust gas. The pre-treatment gas concentration detection device 112 is, for example, a gas sensor or a Fourier transform infrared spectrometer (FTIR). The process exhaust gas treatment device 114 is used to purify the semiconductor manufacturing process exhaust gas and emit a post-treatment gas. The process exhaust gas treatment device 114 may be a scrubber. The reducing agent supply device 116 is used to supply a reducing agent gas into the process exhaust gas treatment device 114. The reducing agent supply device 116 may include, but not limited to, a reducing agent gas cylinder G3, a reducing agent gas controller 124, and a mass flow controller (MFC) 122. The reducing agent gas controller 124 may receive a signal from the addition system control device 120, and may control the MFC 122 to determine a flow rate of the reducing agent gas entering the process exhaust gas treatment device 114. The post-treatment gas concentration detection device 118 is used to detect the post-treatment gas emitted from the process exhaust gas treatment device 114 and obtain a post-treatment concentration of various process gases and a residual concentration of the reducing agent gas in the post-treatment gas. The post-treatment gas concentration detection device 118 is, for example, a gas sensor or an FTIR. For example, in the present embodiment, since there are two process gases and the reducing agent gas, the post-treatment concentration of the two process gases and the residual concentration of the reducing agent gas are obtained.

In FIG. 1, the addition system control device 120 is used to calculate destruction and removal efficiency (DRE) for the process gases according to the pre-treatment concentration and the post-treatment concentration, and, according to the DRE and the residual concentration of the reducing agent gas, send the signal to the reducing agent supply device 116 to control the amount of the reducing agent gas added.

The DRE may be expressed by the following equation (1):

$$DRE=1-(C_{out}/C_{in})(Q_{out}/Q_{in}) \qquad (1)$$

In equation (1), DRE represents treatment efficiency for a process gas, $C_{out}$ represents the post-treatment concentration, $C_{in}$ represents the pre-treatment concentration, $Q_{out}$ represents an outlet air volume of the process exhaust gas treatment device 114, and $Q_{in}$ represents an inlet air volume of the process exhaust gas treatment device 114. $Q_{in}$ and Q out may be inputted by a user or be obtained through measurement.

In one embodiment, the addition system control device 120 may send a signal to the reducing agent supply device 116 when the residual concentration of the reducing agent gas exceeds a set value, so as to reduce the flow rate of the reducing agent gas to a system set initial value.

Each of the process gases has a set value and a target range for the DRE. The set value is a lower limit of the target range. In one embodiment, when the DRE for all the process gases reaches the set value, and the DRE for at least one of the process gases exceeds an upper limit of the target range, the addition system control device 120 sends a signal to the reducing agent supply device 116 to reduce the flow rate of the reducing agent gas. In another embodiment, when the DRE for at least one of the process gases is less than the set value, the addition system control device 120 sends the signal to the reducing agent supply device 116 to increase the amount of the reducing agent gas added.

Referring again to FIG. 1, the reducing agent addition system 110 in the semiconductor manufacturing process may further include a system communication module CM which communicates with the pre-treatment gas concentration detection device 112, the post-treatment gas concentration detection device 118, and (the reducing agent gas controller 124 of) the addition system control device 120. The system communication module CM may further communicate with the process gas controller 106 to provide feedback on a pre-treatment gas concentration value, such that the process gas controller 106 adjusts the flow rate of the process gases entering the semiconductor manufacturing process reaction chamber 100. Establishment of the system communication module CM enables the addition system control device 120 to receive signals from and issue commands to a component of the system, so as to achieve functions and purposes of the system. Establishment of the system communication module CM also unifies formats of communication by hardware or software, facilitating the future application and expansion of system functions. For example, the communication format may include Modbus, Ethercat, Ethernet or the like, depending on a control device; the hardware format may include RJ45, RS232, RS485 or the like, depending on a control device. However, the disclosure is not limited thereto.

Figure 2:
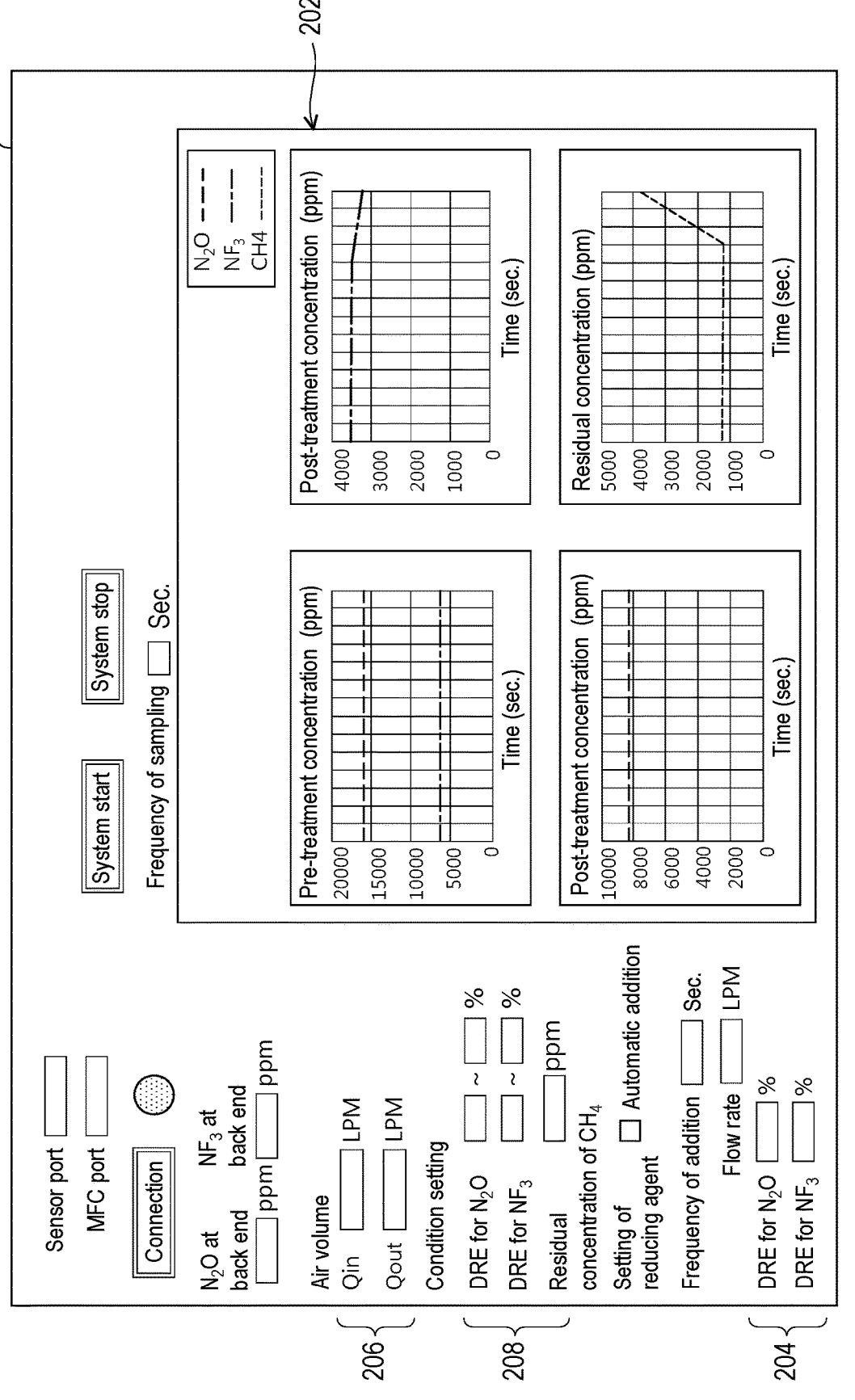
FIG. 2 is a schematic diagram of a display panel in the reducing agent addition system in the semiconductor manufacturing process of the first embodiment.

The reducing agent addition system 110 in the semiconductor manufacturing process of the first embodiment may further include a display panel 200 as illustrated in FIG. 2. The display panel 200 may be installed in the addition system control device 120 for the user to obtain real-time information.

Referring to FIG. 2, it is assumed that the process gas includes $NF_3$ and $N_2O$ and the reducing agent gas includes $CH_4$. The display panel 200 may include a concentration display area 202 displaying a pre-treatment concentration of NF₃ and N₂O, a post-treatment concentration of NF₃ and N₂O, and a residual concentration of CH₄ as the reducing agent gas, which vary with time, as well as a process gas treatment efficiency display area 204. The concentration display area 202 displays a concentration in a curve graph. However, the concentration may be displayed in numbers or in both a curve graph and numbers. The display panel 200 may further include an air volume display area 206 displaying the outlet air volume and inlet air volume of the process exhaust gas treatment device (114). The display panel 200 may further include a condition setting area 208 displaying a target range of DRE for various process gases and a set value of the residual concentration of the reducing agent gas, and numerical ranges thereof can be adjusted according to user needs. The display panel 200 may omit some information, or may display other information such as frequency of sampling, frequency of addition of a reducing agent (gas), and flow rate, as illustrated in FIG. 2.

Figure 3:
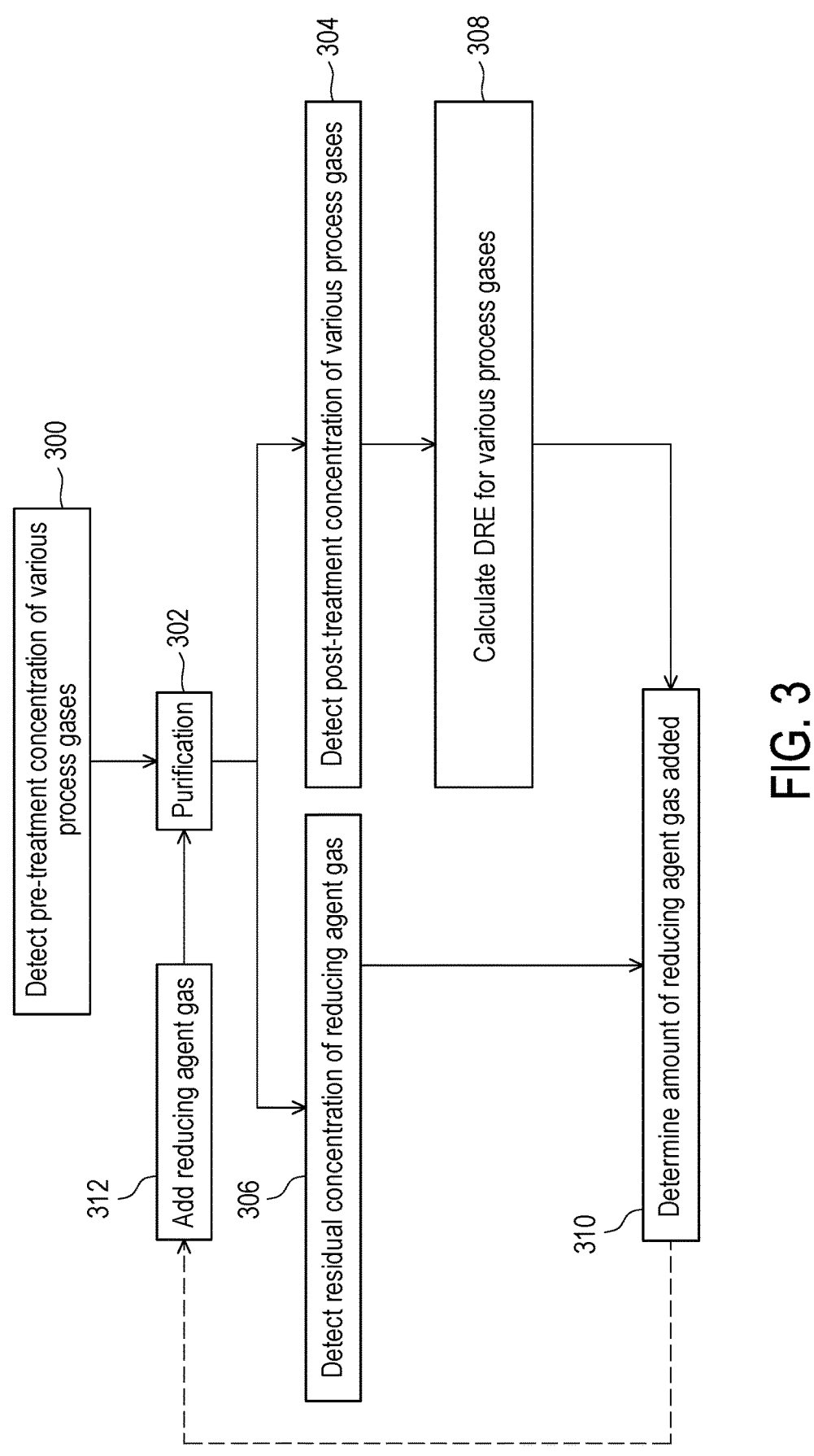
FIG. 3 is a flowchart of adding a reducing agent in a semiconductor manufacturing process according to a second embodiment of the disclosure.

FIG. 3 is a flowchart of adding a reducing agent in a semiconductor manufacturing process according to a second embodiment of the disclosure.

In step 300, a pre-treatment concentration of various process gases in a semiconductor manufacturing process exhaust gas before entry into a process exhaust gas treatment device is detected. There are two or more process gases, and a detection device is, for example, a gas sensor or an FTIR.

In step 302, the semiconductor manufacturing process exhaust gas is purified using a process exhaust gas treatment device such as the process exhaust gas treatment device 114 of the first embodiment. A reducing agent gas is added into the process exhaust gas treatment device.

In step 304, a post-treatment concentration of the process gases in a post-treatment gas emitted from the process exhaust gas treatment device is detected. In step 306, a residual concentration of the reducing agent gas is detected. A device used in the aforementioned detection steps is, for example, a gas sensor or an FTIR.

In step 308, destruction and removal efficiency (DRE) for the process gases is calculated according to the pre-treatment concentration measured in step 300 and the post-treatment concentration measured in step 304. The DRE may be expressed by equation (1) of the first embodiment, and description thereof is therefore omitted.

Then, according to the DRE obtained in step 308 and the residual concentration of the reducing agent gas measured in step 306, step 310 is performed in which the amount of the reducing agent gas added is determined.

In step 312, the reducing agent gas is added according to a result of step 310. That is, if it is determined in step 310 to reduce a flow rate of the reducing agent gas, the flow rate of the reducing agent gas added for the purification step (302) is reduced; on the other hand, if it is determined in step 310 to increase the amount of the reducing agent gas added, the flow rate of the reducing agent gas added for the purification step (302) is increased. In the second embodiment, real-time measurement is possible throughout steps 300 to 310. For example, various concentration values may be measured every second, and the reducing agent gas may be added in real time or on time according to the result of step 310.

Figure 4:
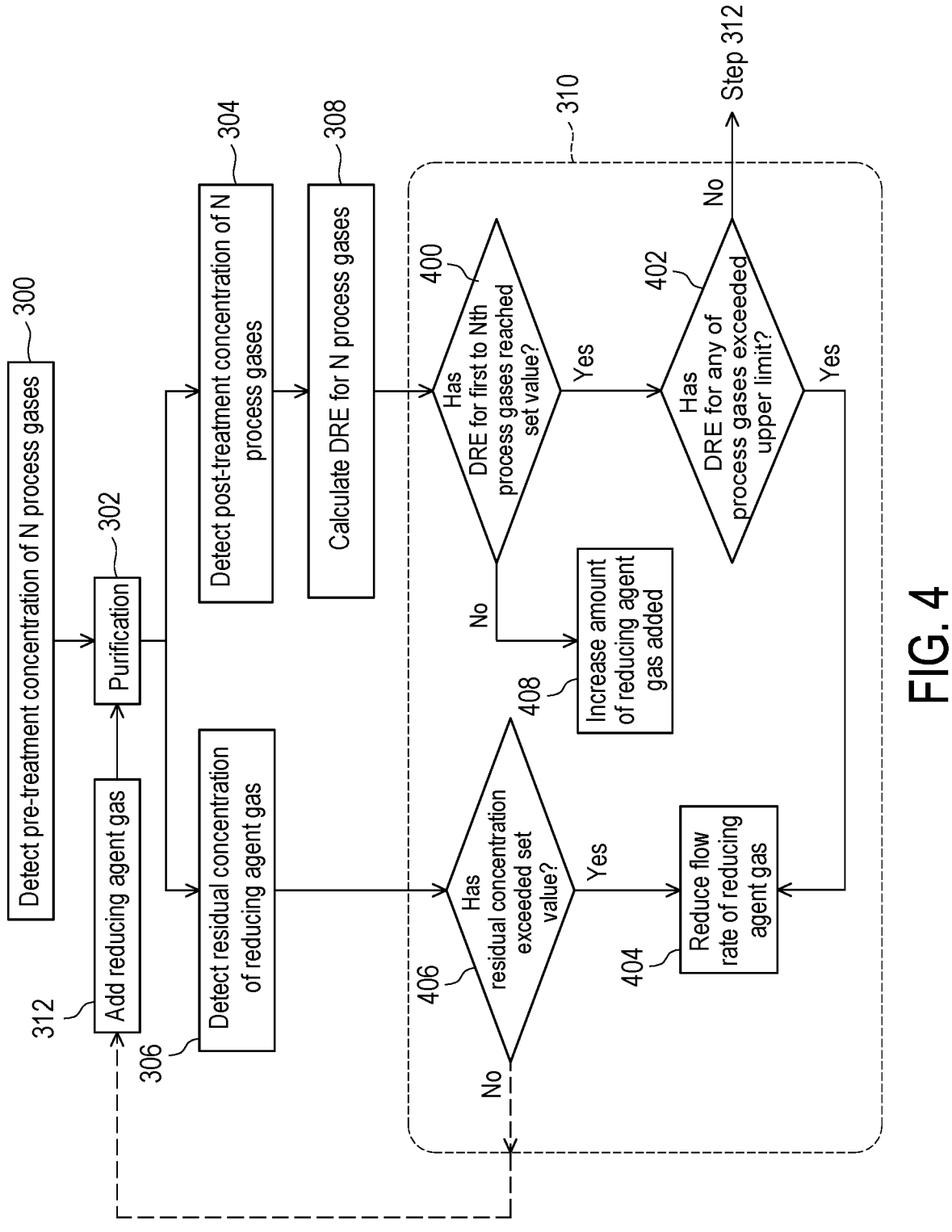
FIG. 4 is a flowchart of adding a reducing agent in a semiconductor manufacturing process according to a third embodiment of the disclosure.

FIG. 4 is a flowchart of adding a reducing agent in a semiconductor manufacturing process according to a third embodiment of the disclosure, in which steps 300 to 308 are the same as those of the second embodiment and can be understood with reference to the description of the second embodiment. Details of step 310 will be described.

Referring to FIG. 4, in step 400, if the destruction and removal efficiency (DRE) for all the process gases (the first to Nth process gases, where N is greater than 1) has reached a set value, step 402 is performed to determine a subsequent treatment method; if the DRE for at least one of the process gases has not reached the set value, step 408 is performed. In the present embodiment, each of the process gases has a set value and a target range for the DRE, where the set value is a lower limit of the target range.

In step 402, if the DRE for at least one of the process gases has exceeded an upper limit, step 404 is performed; if the DRE for none of the process gases has exceeded the upper limit, the process returns to step 312 in which the reducing agent gas is added directly without a need for adjustment of the flow rate.

In step 404, it is determined that the flow rate of the reducing agent gas is to be reduced. Based on this determination, step 312 is performed in which the flow rate of the reducing agent gas added is reduced.

In step 406, if the residual concentration of the reducing agent gas has exceeded a set value, step 404 is performed. In one embodiment, the flow rate of the reducing agent gas may be reduced to a system set initial value. If the residual concentration of the reducing agent gas has not exceeded the set value, the process returns to step 312 in which reducing agent gas is added directly without a need for adjustment of the flow rate.

In step 408, it is determined that the amount of the reducing agent gas added is to be increased. Based on this determination, step 312 is performed in which the flow rate of the reducing agent gas added is increased.

The following experiments are provided to illustrate operation of the system of the disclosure. However, the disclosure is not limited to the following content.

Experimental Example 1

In Experimental Example 1, a process gas included NF₃ and N₂O, a reducing agent gas included CH₄, a target range of DRE for NF₃ was 85% to 99% (i.e. the set value of the DRE for NF₃ was 85%), a target range of DRE for N₂O was 70% to 85% (i.e. the set value of the DRE for N₂O was 70%), and a set value of a residual concentration for CH₄ was 4000 ppm. The system as shown in FIG. 1 was employed. A chamber temperature of the process exhaust gas treatment device 114 was set to 570° C. for purification. After a period of time, FIG. 5A and FIG. 5B were obtained.

Figure 5A:
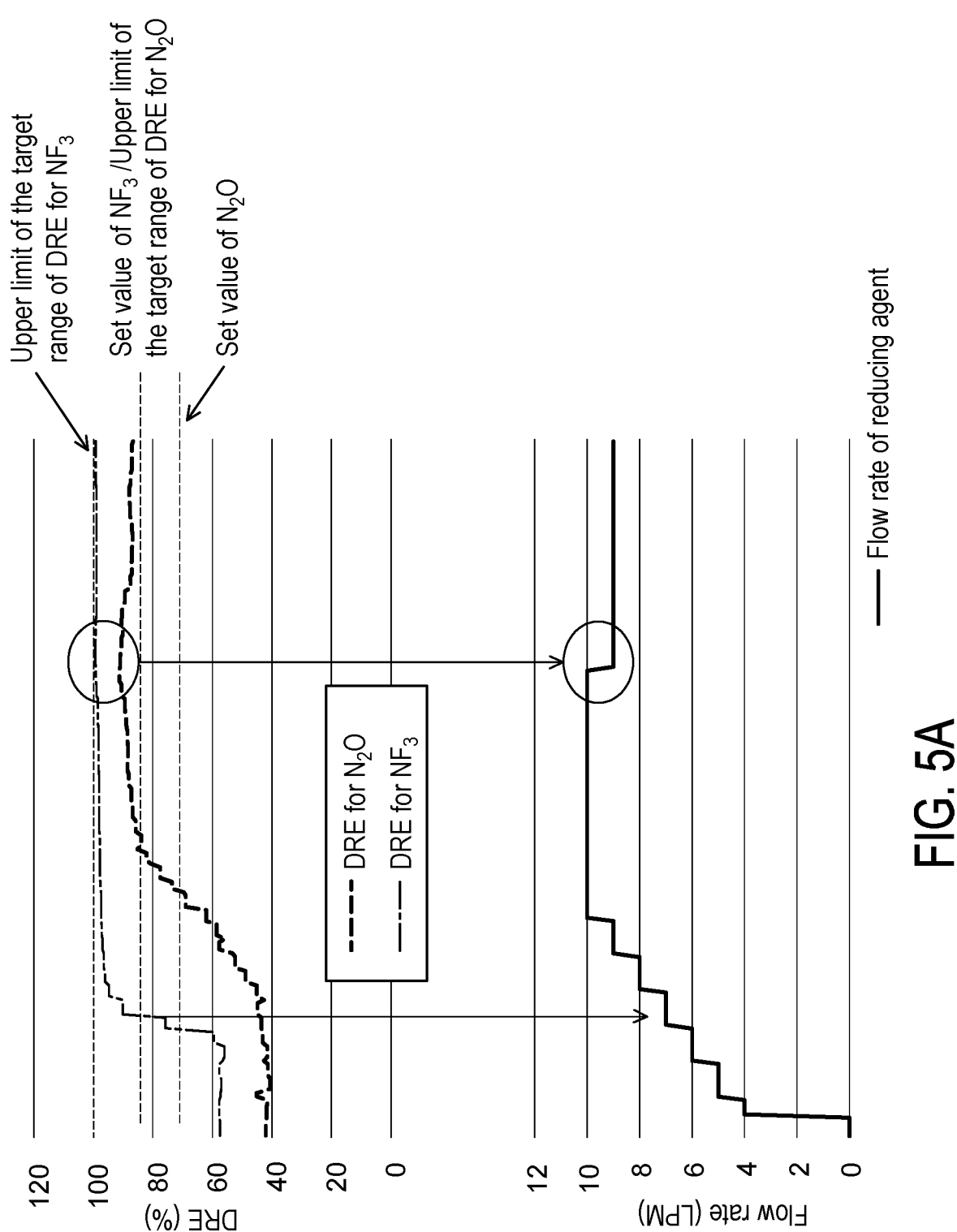
FIG. 5A is a curve diagram illustrating a relationship between destruction and removal efficiency for a process gas and flow rate of a reducing agent in Experimental Example 1.
Figure 5B:
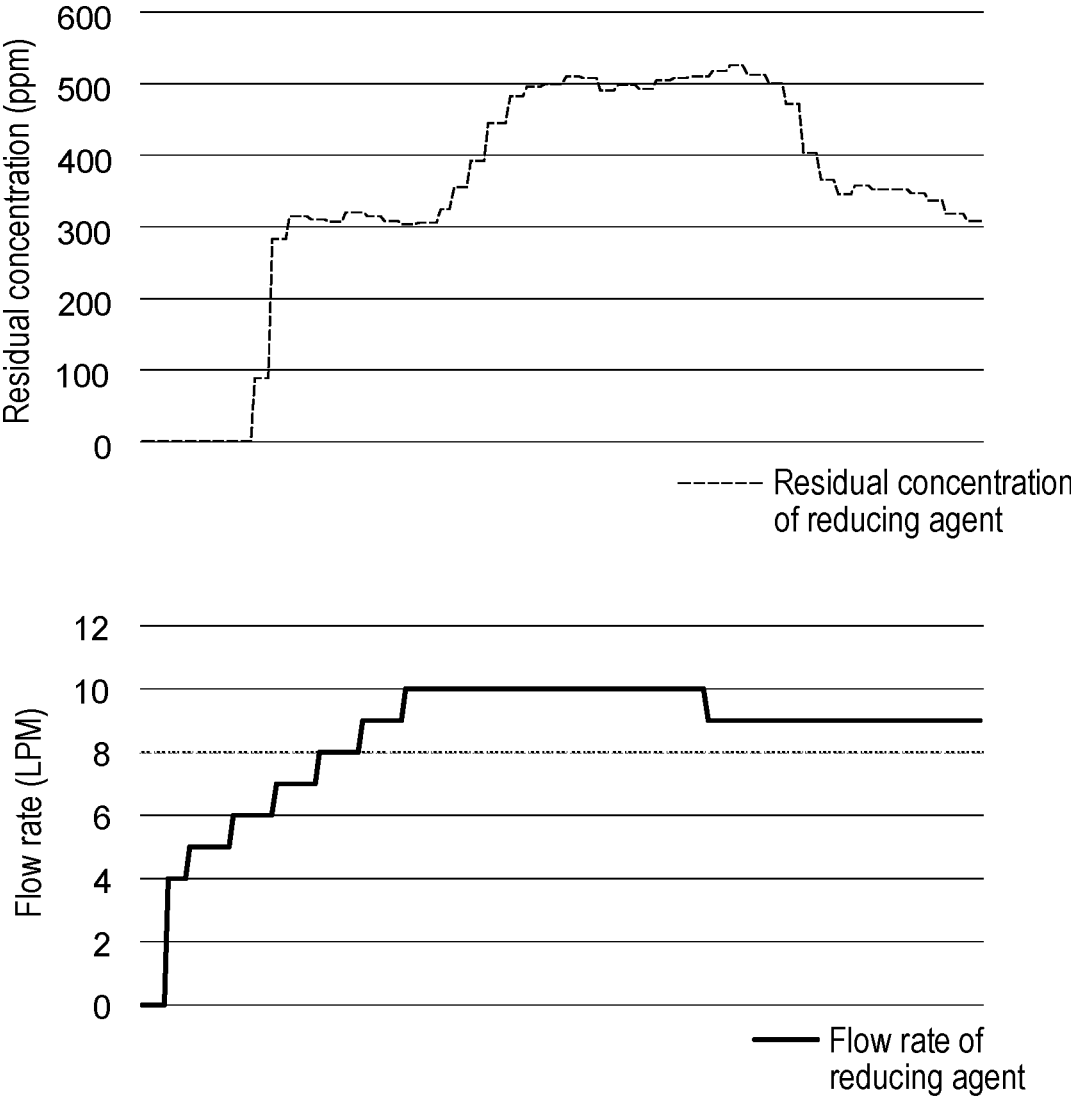
FIG. 5B is a curve diagram illustrating a relationship between residual concentration of the reducing agent and flow rate of the reducing agent in Experimental Example 1.

FIG. 5A is a curve diagram illustrating a relationship between destruction and removal efficiency for a process gas and flow rate of a reducing agent. FIG. 5B is a curve diagram illustrating a relationship between residual concentration of the reducing agent and flow rate of the reducing agent. It is known from FIG. 5A and FIG. 5B that, when the DRE for both NF₃ and N₂O as the process gases had not reached the set value, and the residual concentration of the reducing agent had not exceeded the set value of 4000 ppm, the flow rate of the reducing agent was continuously increased, as indicated by the arrow on the left side of FIG. 5A. When the DRE for both NF₃ and N₂O as the process gases reached the set value and the DRE for N₂O exceeded an upper limit of 85%, the flow rate of the reducing agent was reduced, as indicated by the arrow on the right side of FIG. 5A, so as to save energy.

Experimental Example 2

The same conditions as those of Experimental Example 1 were adopted except that the chamber temperature of the process exhaust gas treatment device 114 was changed to 540° C. for purification. After a period of time, FIG. 6A and FIG. 6B were obtained.

Figure 6A:
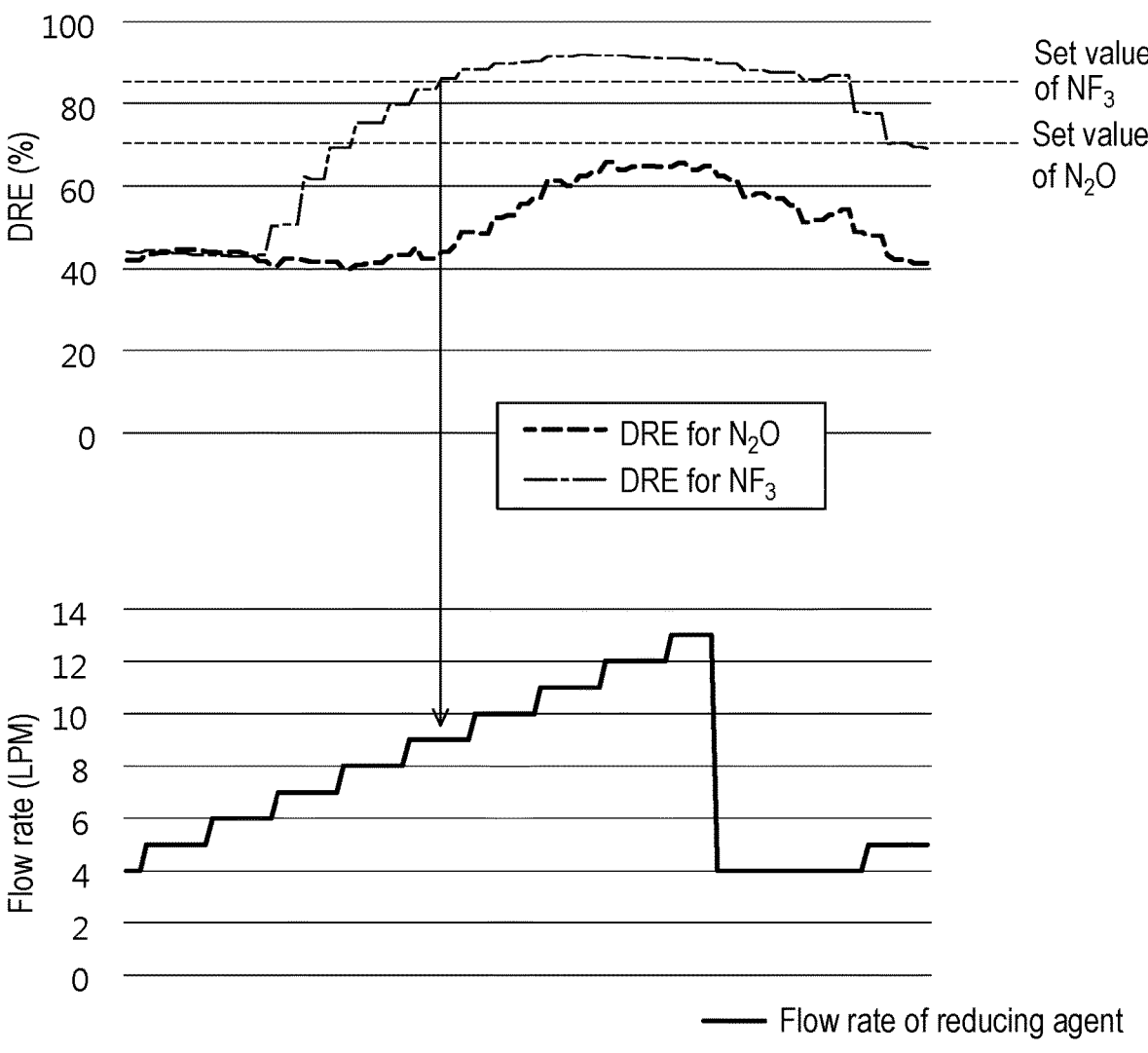
FIG. 6A is a curve diagram illustrating a relationship between destruction and removal efficiency for a process gas and flow rate of a reducing agent in Experimental Example 2.
Figure 6B:
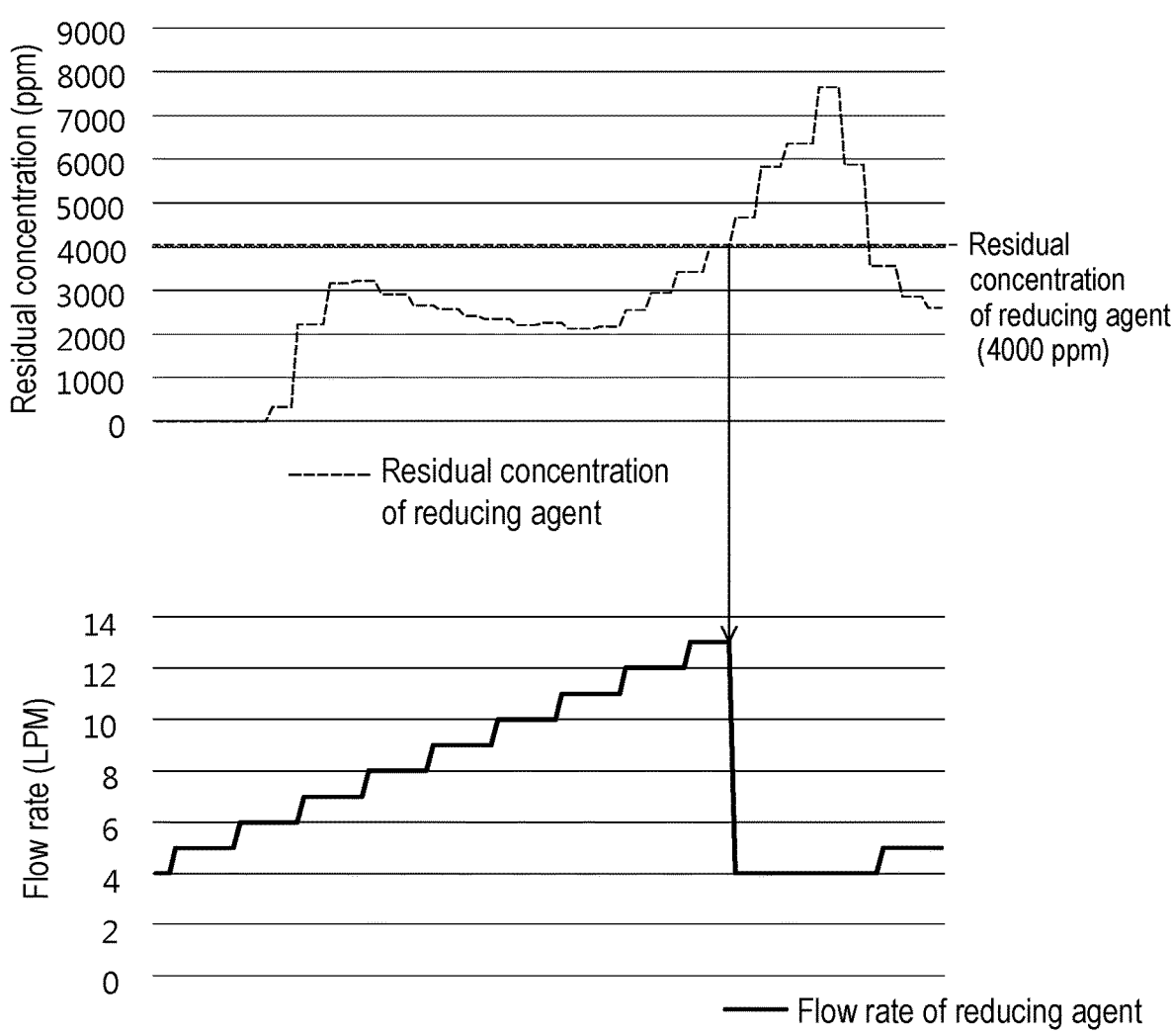
FIG. 6B is a curve diagram illustrating a relationship between residual concentration of the reducing agent and flow rate of the reducing agent in Experimental Example 2.

FIG. 6A is a curve diagram illustrating a relationship between destruction and removal efficiency for a process gas and flow rate of a reducing agent in Experimental Example 2. FIG. 6B is a curve diagram illustrating a relationship between residual concentration of the reducing agent and flow rate of the reducing agent in Experimental Example 2. It is known from FIG. 6A that, when the DRE for $NF_3$ as the process gas reached the set value while the DRE for $N_2O$ had not reached the set value (as indicated by the arrow in FIG. 6A), the flow rate of the reducing agent gas was increased. However, it is known from FIG. 6B that, when the residual concentration of the reducing agent gas exceeded the set value of 4000 ppm, there was a need to reduce the flow rate of the reducing agent gas to a system set initial value of 4 LPM for another cycle. However, it can be found by referring also to FIG. 6A that, at the time when the flow rate of the reducing agent gas was reduced, the DRE for $N_2O$ had not reached the set value.

Thus, it is found from Experimental Example 2 that, under strict conditions such as the residual concentration of 4000 ppm, balance in the system may not be achieved if the chamber temperature of the process exhaust gas treatment device 114 is set to 540° C. Therefore, it may be necessary to increase the chamber temperature or to relax emission standards for the residual concentration of the reducing agent gas.

Experimental Example 3

The same conditions as those of Experimental Example 2 were adopted except that the set value of the residual concentration of $CH_4$ as the reducing agent gas was changed to 10000 ppm. After a period of time, FIG. 7A and FIG. 7B were obtained.

Figure 7A:
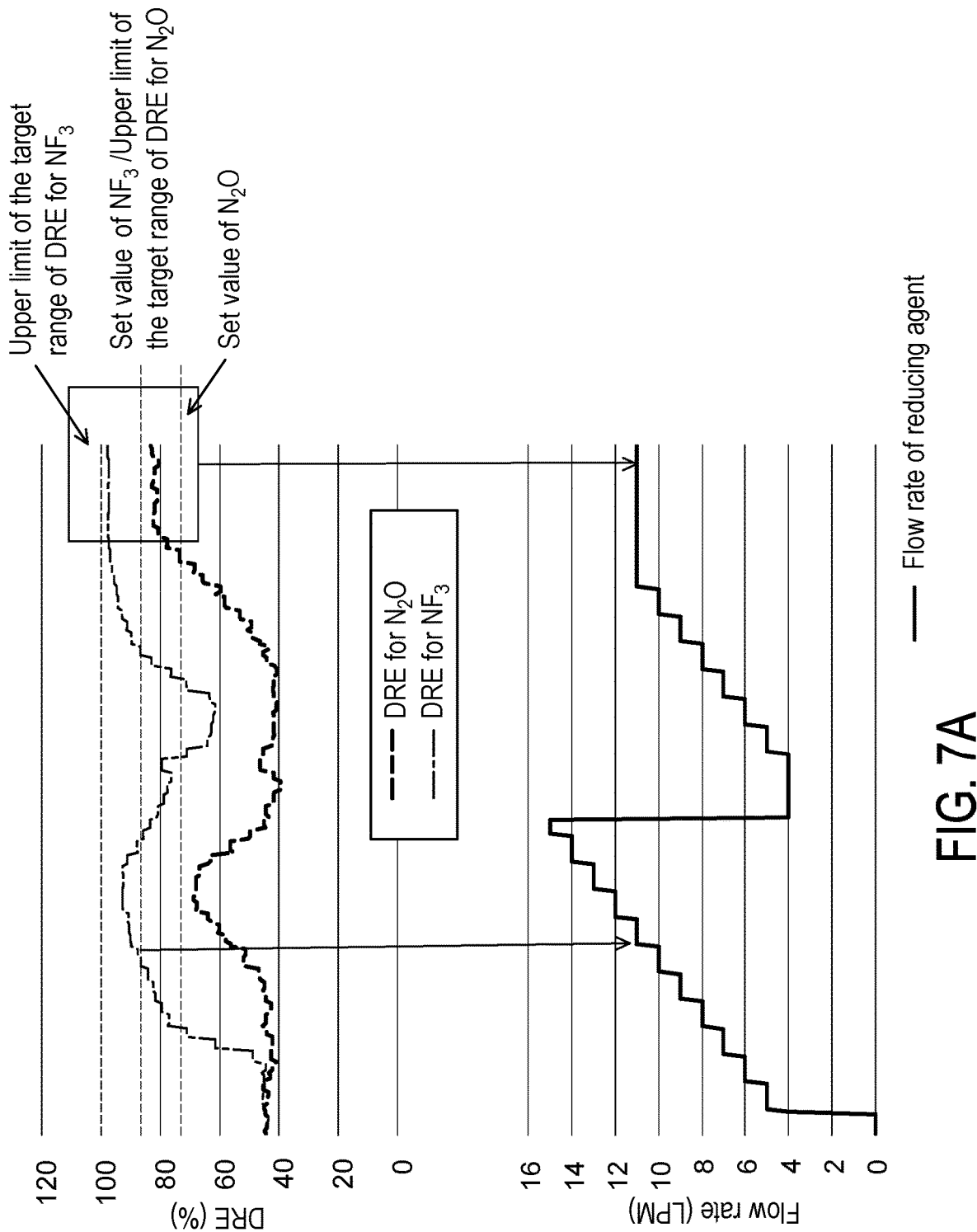
FIG. 7A is a curve diagram illustrating a relationship between destruction and removal efficiency for a process gas and flow rate of a reducing agent in Experimental Example 3.
Figure 7B:
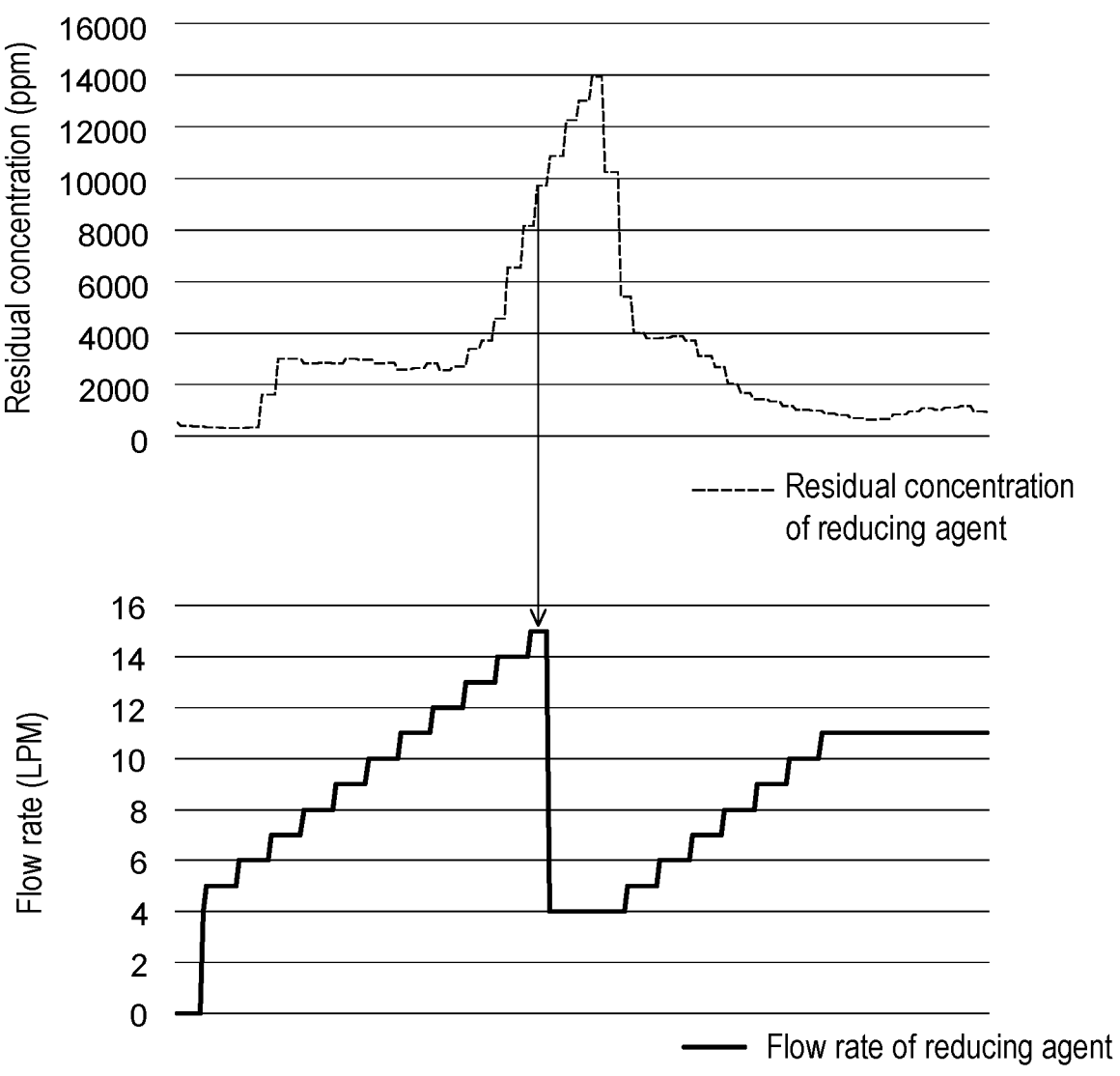
FIG. 7B is a curve diagram illustrating a relationship between residual concentration of the reducing agent and flow rate of the reducing agent in Experimental Example 3.

FIG. 7A is a curve diagram illustrating a relationship between destruction and removal efficiency for a process gas and flow rate of a reducing agent in Experimental Example 3. FIG. 7B is a curve diagram illustrating a relationship between residual concentration of the reducing agent and flow rate of the reducing agent in Experimental Example 3.

It is known from FIG. 7A that, when the DRE for $NF_3$ as the process gas reached the set value while the DRE for $N_2O$ had not reached the set value, the flow rate of the reducing agent was continuously increased, as indicated by the arrow on the left side of FIG. 7A.

It is known from FIG. 7B that, when the residual concentration of the reducing agent gas exceeded the set value of 10000 ppm, as indicated by the arrow in FIG. 7B, there was a need to reduce the flow rate of the reducing agent gas to the system set initial value of 4 LPM for another cycle.

It is found from FIG. 7A that the reaction between the reducing agent gas and the process gas in the process exhaust gas treatment device 114 gradually increased the DRE over time, such that the flow rate of the reducing agent (that is, the amount of the reducing agent gas added) in the system gradually became stable, thereby achieving balance in the system.

In summary, in the addition system and method of a reducing agent in a semiconductor manufacturing process according to the disclosure, the DRE for the process gas in the process exhaust gas treatment device is improved and excessive residual reducing agent is prevented, such that the residual concentration of the reducing agent satisfies safety standards. Thus, energy efficiency and safety are achieved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An addition system of a reducing agent in a semiconductor manufacturing process, adapted to control amount of a reducing agent added for a semiconductor manufacturing process exhaust gas, the addition system comprising:
   a pre-treatment gas concentration detection device, detecting a pre-treatment concentration of a plurality of process gases in the semiconductor manufacturing process exhaust gas;
   a process exhaust gas treatment device, purifying the semiconductor manufacturing process exhaust gas and emitting a post-treatment gas;
   a reducing agent supply device, supplying a reducing agent gas into the process exhaust gas treatment device;
   a post-treatment gas concentration detection device, detecting a post-treatment concentration of the plurality of process gases and a residual concentration of the reducing agent gas in the post-treatment gas; and
   an addition system control device, calculating destruction and removal efficiency for the plurality of process gases according to the pre-treatment concentration and the post-treatment concentration, and, according to the destruction and removal efficiency and the residual concentration of the reducing agent gas, sending a signal to the reducing agent supply device to control amount of the reducing agent gas added, wherein the destruction and removal efficiency is expressed by equation (1):

$$DRE=1-(C_{out}/C_{in})(Q_{out}/Q_{in}) \qquad (1)$$

wherein DRE represents treatment efficiency for a process gas, $C_{out}$ represents the post-treatment concentration, $C_{in}$ represents the pre-treatment concentration, $Q_{out}$ represents an outlet air volume of the process exhaust gas treatment device, and $Q_{in}$ represents an inlet air volume of the process exhaust gas treatment device.

2. The addition system of a reducing agent in a semiconductor manufacturing process according to claim 1, wherein, in response to the residual concentration of the reducing agent gas exceeding a set value, the addition system control device sends the signal to reduce a flow rate of the reducing agent gas to a system set initial value.

3. The addition system of a reducing agent in a semiconductor manufacturing process according to claim 1, wherein each of the plurality of process gases has a set value and a target range for the destruction and removal efficiency, in which the set value is a lower limit of the target range.

4. The addition system of a reducing agent in a semiconductor manufacturing process according to claim 3, wherein, in response to the destruction and removal efficiency for all of the plurality of process gases reaching the set value, and the destruction and removal efficiency for at least one of the plurality of process gases exceeding an upper limit of the target range, the addition system control device sends the signal to reduce a flow rate of the reducing agent gas.

5. The addition system of a reducing agent in a semiconductor manufacturing process according to claim 3, wherein, in response to the destruction and removal efficiency for at least one of the plurality of process gases being less than the set value, the addition system control device sends the signal to increase the amount of the reducing agent gas added.

6. The addition system of a reducing agent in a semiconductor manufacturing process according to claim 1, wherein the addition system control device further comprises a display panel configured to display the pre-treatment concentration, the post-treatment concentration, the residual concentration of the reducing agent gas and the destruction and removal efficiency that vary with time.

7. The addition system of a reducing agent in a semiconductor manufacturing process according to claim 6, wherein the display panel further displays an outlet air volume and an inlet air volume of the process exhaust gas treatment device.

8. The addition system of a reducing agent in a semiconductor manufacturing process according to claim 7, wherein the display panel further displays a target range of the destruction and removal efficiency for the plurality of process gases and a set value of the residual concentration of the reducing agent gas.

9. The addition system of a reducing agent in a semiconductor manufacturing process according to claim 1, further comprising:

a system communication module, communicating with the pre-treatment gas concentration detection device, the post-treatment gas concentration detection device and the addition system control device.

10. An addition method of a reducing agent in a semiconductor manufacturing process, comprising:

detecting a pre-treatment concentration of a plurality of process gases in a semiconductor manufacturing process exhaust gas before entry into a process exhaust gas treatment device;

purifying the semiconductor manufacturing process exhaust gas using the process exhaust gas treatment device, wherein a reducing agent gas is added into the process exhaust gas treatment device;

detecting a post-treatment concentration of the plurality of process gases and a residual concentration of the reducing agent gas in a post-treatment gas emitted from the process exhaust gas treatment device; and calculating destruction and removal efficiency for the plurality of process gases according to the pre-treatment concentration and the post-treatment concentration, and, according to the destruction and removal efficiency and the residual concentration of the reducing agent gas, determining amount of the reducing agent gas added, wherein the destruction and removal efficiency is expressed by equation (1):

$$DRE=1-(C_{out}/C_{in})(Q_{out}/Q_{in}) \tag{1}$$

wherein DRE represents treatment efficiency for a process gas, $C_{out}$ represents the post-treatment concentration, $C_{in}$ represents the pre-treatment concentration, $Q_{out}$ represents an outlet air volume of the process exhaust gas treatment device, and $Q_{in}$ represents an inlet air volume of the process exhaust gas treatment device.

11. The addition method of a reducing agent in a semiconductor manufacturing process according to claim 10, further comprising:

in response to the residual concentration of the reducing agent gas exceeding a set value, reducing a flow rate of the reducing agent gas to a system set initial value.

12. The addition method of a reducing agent in a semiconductor manufacturing process according to claim 10, wherein each of the plurality of process gases has a set value and a target range for the destruction and removal efficiency, in which the set value is a lower limit of the target range.

13. The addition method of a reducing agent in a semiconductor manufacturing process according to claim 12, further comprising:

in response to the destruction and removal efficiency for all of the plurality of process gases reaching the set value, and the destruction and removal efficiency for at least one of the plurality of process gases exceeding an upper limit of the target range, reducing a flow rate of the reducing agent gas.

14. The addition method of a reducing agent in a semiconductor manufacturing process according to claim 12, further comprising:

in response to the destruction and removal efficiency for at least one of the plurality of process gases being less than the set value, increasing the amount of the reducing agent gas added.

* * * * *